(12) United States Patent
Habering et al.

(10) Patent No.: US 11,838,071 B2
(45) Date of Patent: Dec. 5, 2023

(54) SYSTEM FOR MONITORING CABLES IN A LINE GUIDE APPARATUS; IN PARTICULAR IN AN ENERGY CHAIN

(71) Applicant: igus GmbH, Cologne (DE)

(72) Inventors: Richard Habering, Cologne (DE); Sebastian Krista, Hennef (DE)

(73) Assignee: igus GmbH, Cologne (DE)

( * ) Notice: Subject to any disclaimer, the term of this patent is extended or adjusted under 35 U.S.C. 154(b) by 153 days.

(21) Appl. No.: 17/295,410

(22) PCT Filed: Nov. 19, 2019

(86) PCT No.: PCT/EP2019/081859
§ 371 (c)(1),
(2) Date: May 19, 2021

(87) PCT Pub. No.: WO2020/104491
PCT Pub. Date: May 28, 2020

(65) Prior Publication Data
US 2022/0014232 A1 Jan. 13, 2022

(30) Foreign Application Priority Data
Nov. 19, 2018 (DE) ............ 20 2018 106 543.2

(51) Int. Cl.
*H04B 3/46* (2015.01)
*H04B 3/60* (2006.01)

(52) U.S. Cl.
CPC ............ *H04B 3/46* (2013.01); *H04B 3/60* (2013.01)

(58) Field of Classification Search
CPC .......... H04B 3/46; H04B 3/60; H02G 11/006; G01R 31/58
See application file for complete search history.

(56) References Cited

U.S. PATENT DOCUMENTS

| | | | |
|---|---|---|---|
| 5,980,409 A | 11/1999 | Blase | |
| 11,567,146 B2 * | 1/2023 | Gundel | .......... G01K 7/42 |

(Continued)

FOREIGN PATENT DOCUMENTS

| | | |
|---|---|---|
| EP | 0 803 032 B1 | 6/2000 |
| WO | 02/086349 A1 | 10/2002 |

(Continued)

OTHER PUBLICATIONS

The International Bureau of WIPO, English Translation of the International Preliminary Report for PCT Application No. PCT/EP2019/081859, dated Jun. 3, 2021, pp. 1-9.

(Continued)

*Primary Examiner* — Khanh C Tran
(74) *Attorney, Agent, or Firm* — CAHN & SAMUELS, LLP

(57) ABSTRACT

A monitoring system is proposed for monitoring the state of a cable which is routed through a cable routing device or an energy chain. A monitoring apparatus (10; 20; 30) is provided for this purpose and has an evaluation unit which determines information relating to the state of the cable to be monitored. The invention provides for the monitoring apparatus to comprise a first data communication device (11) with a data communication interface and a second data communication device (12; 12') with a data communication interface. These devices (11,12) are configured for data communication according to a digital data transmission protocol and are connected by means of the interfaces thereof via the cable (13; 13A; 13B) to be monitored. An evaluation unit is also provided and configured to determine information relating to the state of the cable to be monitored on the basis of a quality feature of the data connection, for example the packet loss rate in the case of a packet-based (Continued)

Figure 1:
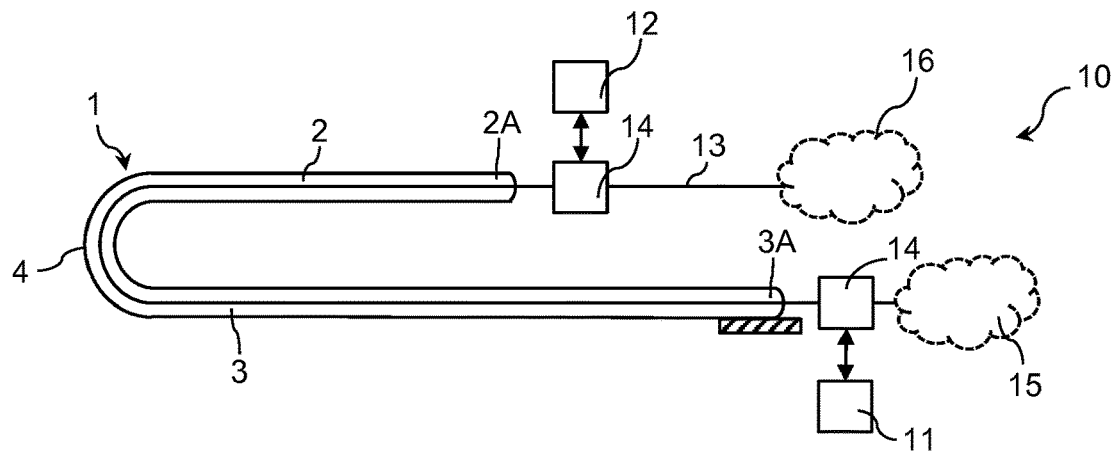

communication protocol, between the first device (11) and the second device (12; 12').

20 Claims, 2 Drawing Sheets

(56) References Cited

U.S. PATENT DOCUMENTS

| | | | | |
|---|---|---|---|---|
| 2013/0154676 A1* | 6/2013 | Wu | ............................ | G01N 3/08 |
| | | | | 324/750.01 |
| 2014/0108786 A1* | 4/2014 | Kreft | .................. | G06Q 20/3825 |
| | | | | 713/194 |
| 2016/0227436 A1* | 8/2016 | Vermani | .................... | H04L 1/08 |
| 2019/0326740 A1* | 10/2019 | Hermey | .................. | F16G 13/18 |
| 2021/0116317 A1 | 4/2021 | Krista | | |
| 2021/0164872 A1* | 6/2021 | Schmer | .................. | H02G 11/00 |
| 2021/0181265 A1* | 6/2021 | Jaeker | ...................... | G01L 19/00 |
| 2021/0311131 A1* | 10/2021 | Gundel | .............. | G01R 31/1227 |

FOREIGN PATENT DOCUMENTS

| | | |
|---|---|---|
| WO | 2004/093279 A1 | 10/2004 |
| WO | 2015/145068 A1 | 10/2015 |
| WO | 2016/042134 A1 | 3/2016 |
| WO | 2018/196949 A1 | 11/2018 |

OTHER PUBLICATIONS

European Patent Office, International Written Opinion for PCT Application No. PCT/EP2019081859, dated May 28, 2020, pp. 3-5.
European Patent Office, International Search Report for PCT Application No. PCT/EP2019081859, dated May 28, 2020, pp. 1-3.
European Patent Office, English Abstract for EP0803032 A1, printed on May 19, 2021.

* cited by examiner

SYSTEM FOR MONITORING CABLES IN A LINE GUIDE APPARATUS; IN PARTICULAR IN AN ENERGY CHAIN

The invention relates in general to a system for monitoring the operational readiness or wear condition of a line guided within or by an active line guide apparatus. Such line guide apparatuses serve in dynamic guidance of at least one line, such as for example a cable, hose or the like, mainly between a stationary connection point or base and a further connection point movable relative thereto, for example a moving end.

The invention relates in particular to a system for monitoring a data line, which for example supplies a mobile part of a machine or installation with data or transmits data coming therefrom, and which is protected or guided by the line guide apparatus.

Line guide apparatuses of the type in question protect typical lines which supply a moving machine or installation components with energy, data and/or operating media. An example of a line guide apparatus of the type in question is a displaceable energy guide chain of per se known design.

When in operation, an energy guide chain displaceable in a single plane typically forms a mobile run with a connection end, a stationary run with a connection end and a deflection arc between the two runs. The applicant proposed energy guide chains which can travel in one plane, e.g. horizontally or vertically, for example in EP 0 803 032 B1 or WO 02/086349 A1. Furthermore, three-dimensionally deflectable energy guide chains are known, which are used in particular in industrial robots. A three-dimensionally deflectable energy guide chain was proposed by the applicant, for example, in WO 2004/093279 A1.

Irrespective of the design of the line guide apparatus or energy guide chain, the guided lines are dynamically loaded when in operation. The lines are subject to unavoidable wear and are therefore at risk of failure as the number of movement cycles performed increases.

In addition to the line guide apparatus, the system comprises a monitoring device with at least one evaluation unit which detects information about the condition, in particular wear condition, of the line to be monitored.

A system with a displaceable line guide apparatus, at least one line, and a monitoring device is known from WO 2018/196949 A1. This system allows line monitoring in ongoing operation for the purpose of early identification of imminent line failure, in particular for the purpose of predictive maintenance or for the avoidance of undesired failure of the supplied machine or installation. To this end, the system of WO 2018/196949 A1 requires a special indicator conductor and a circuit with a measurement apparatus for measuring resistance or conductance.

In particular, movably guided data lines are typically more susceptible to wear or have a shorter service life compared to power supply lines, due inter alia to more stringent requirements with regard to line quality.

It is an object of the present invention to propose an alternative solution, which is intended in particular to be less costly to implement than the previously known solution. This object is achieved by a system according to at least one embodiment. Advantageous or preferred embodiments are revealed by additional embodiments. A further object consists in proposing a monitoring system particularly suitable for more wear-susceptible data lines.

In the simplest and most general form, the object is achieved in that the monitoring device comprises a first device with interface for data communication and a second device with interface for data communication, wherein the devices or interfaces for data communication are configured according to a protocol for digital data transmission. In this case, the interfaces of the two devices are connected via a line guided at least over a part of its length by or in the line guide apparatus. The evaluation unit is set up or configured according to the invention in such a way that it obtains or detects information about the condition, in particular the wear condition, of the line to be monitored on the basis of an information technological quality feature of the data link between the first device and the second device. An information technological (meaning IT-based) quality feature is in particular a feature which is dependent on the quality of the data link, which can be determined using an information technology-based method, in particular an information technological (IT-based) method already known per se. The quality feature may, for example, correspond to a selected transmission property or an indicator therefor.

Two significant advantages of this solution consist, on the one hand, in that per se known data communications technology, such as, for example, network technology or bus technology, can be used and, on the other hand, that, by using a data link quality feature software-determinable by suitable programming, a conclusion can be drawn as to the wear condition of the line to be monitored or as to whether it is indeed operationally ready. The line to be monitored may in particular, but not necessarily, be the lines producing a data link between the interfaces of the first and second device. The latter line may also be used as an indicator for a different line, considered critical, to be monitored. A further advantage lies in the fact that no special indicator conductors are needed expressly for monitoring (no "sacrificial wires", so to speak), but rather an already available or existing digital communications line can be utilized. The proposed solution also generally does not require any modification or particular adaptation of the monitored line.

A quality feature of the data link determinable using IT or data processing technology enables a conclusion to be drawn as to the condition of the data line. Degradation of a previously relatively high connection quality is a strong indicator for wear caused by dynamic loading, for instance the movement cycles of the energy guide chain, or indeed by any other possible malfunction, for example a break in the chain, or for an interruption of the data line. A conclusion may be drawn directly or indirectly therefrom as to the condition of the monitored line, wherein the latter does not necessarily have to correspond to the data line. The quality feature of the data link may in this case be determined or detected by per se known software functions. The solution is thus simple and inexpensive to implement.

An information technological quality feature of the data link is, in the present sense, in particular an IT-detectable gradation of the higher or lower quality of the data link between the first device and the second device, which is embodied physically by a line guided at least in part in the line guide apparatus.

The evaluation unit may be an integral component of the first device or take the form of a separate module. The evaluation unit may be provided in the form of application-specific hardware or as a purely software module on a computer.

The proposed system is suitable in principle for monitoring electrical or indeed optical lines, in particular at least also lines suitable for data transmission. The invention enables monitoring, in particular direct monitoring of the operational readiness, of data lines and/or bus lines, also, for example, of lines for control purposes, such as motor and/or servo lines, which transmit data digitally.

A suitable protocol is preferably a protocol for packet-based digital data transmission. In one embodiment, provision is made for the communications protocol for data transmission to be a data network protocol, preferably a protocol according to IEEE 802.3. Per se known technologies such as for example ETHERNET, PROFIBUS or the like can be used. Devices or interfaces are feasible which are configured for data communication with packet switching. Circuit switching would likewise be conceivable, but is not preferred.

In one alternative embodiment, provision is made for the protocol for data transmission to be a data bus protocol, in particular an industrial field bus protocol. Per se known types of these, such as for instance CAN, EIA-485 or the like are feasible.

Determining or detecting the information technological quality feature of the data link preferably proceeds by utilizing per se known methods for addressing the devices or interfaces. Each interface preferably has a unique address for data communication, which is uniquely specified in any event in the data network or in the data bus, such as for example an MAC address.

In particular in the case of address-based determination of the quality feature, the quality feature is preferably detected on an IT basis using data transmission, which is addressed to the second device.

In a preferred further development, the evaluation unit is configured to determine the quality feature continuously. The evaluation unit may, for example, compare the currently determined quality feature with a predetermined or aging-dependently adapted reference value, in order to identify or distinguish a "good" case or a "bad" case with regard to the operational readiness of the line to be monitored. The evaluation unit may, for example, be configured to detect the quality feature at regular time intervals.

Owing to the solution according to the invention, the evaluation unit may be configured to determine the quality feature solely on the basis of IT or software, in particular without the need for analog measurement of electrical quantities on the line.

Software-based determination of the quality feature particularly preferably proceeds using protocol-inherent functions to assess connection quality. These functions may be provided in any desired layer of the OSI model.

Determination or assessment of the quality feature may be performed by different software measures, for example, on the basis of:
  availability requests from the first device to the second device; receipt acknowledgments from the second device to the first device; and/or
  packet losses or packet loss rates in packet-based data transmission; and/or
  at least one protocol-inherent function for assessing a quality of service (QoS) parameter, such as, for example, packet loss rates, packet round trip times (RTT), latency times etc. Availability requests, receipt acknowledgments or the detection of packet losses may in this case already be protocol-inherently provided as a function of the data protocol used, or programmed expressly for this purpose.

Other quality features are also feasible, depending on field of application. One preferred approach is currently ongoing monitoring of the packet loss rate and comparison thereof with a threshold value or programmed-in or taught reference value. A plurality of different quality features can also be monitored and evaluated, for example, for the purpose of weighting when deciding about the need to replace the line or for the purpose of cross-checking the monitored parameters relative to one another.

In one embodiment, provision may, for example, be made for the first device to send availability requests, for example, of the ECHO request or PING message type, to the second device in accordance with a higher-level protocol in the OSI model. An ICMP ECHO request according to IP protocol or a UDP echo request or the like are suitable examples. Taking this as basis, the evaluation unit may assess the quality of the data link, for example, on the basis of the absence of corresponding responses from the second device, such as, for example, ECHO responses, PONG messages or the like. The assessment may likewise proceed on the basis of changes to the responses relative to a reference response.

In one embodiment, the first device may comprise or constitute the evaluation unit. The evaluation unit preferably has a programmable integrated circuit, such as, for example, a microcontroller or the like, which is configured to implement one of the above embodiments on a software basis by programming.

To utilize existing technologies, provision may be made for an active network device, such as, for example, an ETHERNET switch, ETHERNET router or the like, to be connected with the line at the base-side connection end of the line guide apparatus, wherein the first device is connected to this network device. Alternatively or in addition, an active network device may likewise be connected with the line at the connection end on the moving end side, wherein the second device is connected to this network device. By using conventional commercial network devices, the hardware needed to provide the evaluation unit may be reduced to a minimum. On the other hand, an expressly or specially provided second device can be used, with minimum hardware expenditure, to provide responses to availability requests. The use of distributing network devices additionally allows the utilization of a data line provided anyway for the desired application for the purposes of the monitoring system.

It is likewise within the bounds of the invention for the monitoring device to utilize as second device a network device or field device with a previously known address which is in any event present in the data network or data bus. Use may in particular be made of an existing device which is not provided specifically for the monitoring system.

Alternatively, however, a second device expressly provided for the monitoring system may also be connected to the data line. In both cases, the first device preferably comprises the evaluation unit or consists of the latter.

The data line used for the data link between the first device and the second device may serve as a sort of indicator for a further line to be monitored which is guided by the line guide apparatus. In this case, this or each further line preferably has a nominal service life which is greater than or at least equal to the nominal service life of the data line which connects the interfaces of the two devices and serves, as it were, as a predetermined breaking point or weak link. Indirect monitoring of another line, which is, for example, particularly critical for the application, may thus proceed. Alternatively, the line to be monitored may of course also comprise the data line between the interfaces or consist thereof.

The interface between the two devices is connected for data communication preferably via an electrical data line, which is guided by the line guide apparatus or energy guide chain. This data line may be provided expressly for the monitoring system, but the invention particularly advantageously also enables the use of an existing data line already present for the application as a component of the monitoring system.

Furthermore, one preferred configuration allows the use of a power supply line for data communication between the first device and the second device, instead of a conventional data line. To this end, the interfaces may, for example, be embodied for POWERLAN, PLC or another IEEE 1901 standard. For instance, the interfaces of the two devices may be connected for signaling via a power supply line guided in the energy guide chain.

In addition or as an alternative, a hybrid servo line may also connect the two data communication devices or their interfaces. A hybrid servo line comprises a servo line for power transmission and an integrated data line, in particular a sensing device line. The advantages of the hybrid servo line, which is often also designated a single cable line or One Cable Technology (OCT) line, are not only less wiring but also savings on space and cost. Data transmission typically proceeds digitally, however, using the widest possible range of bus technologies depending on the manufacturer of the machine supplied.

The first device may be arranged stationarily at the base-side end of the line guide apparatus or on the immobile machine part. The second device is then arranged on the mobile machine part, which is supplied with data and/or energy by the line guide apparatus.

Taking advantage according to the invention of an IT-based or data-technology-based quality feature of the data communication between the two devices may be used particularly advantageously for line monitoring on an industrial robot. The line guide apparatus is then preferably a three-dimensionally deflectable energy guide chain, for example, of the design described in WO 2004/093279 A1. An addressable network or field device provided in any event on the end effector of the industrial robot may then be utilized as second device. Not only but in particular in the case of industrial robots, early identification of an impending line failure is particularly advantageous, since downtime is typically particularly undesirable in automated robot installations.

In addition to energy guide chains consisting of individual links, all other types of dynamic line guide may also be considered in which lines are dynamically loaded when in operation. Purely by way of example, WO 2016/042134 A1 for example discloses a flexible line guideway for clean room applications, to which the invention is likewise applicable.

The proposed monitoring system is however suitable in particular for condition monitoring of a data or power supply cable in ongoing operation of an actual energy guide chain and/or for the purpose of predictive or preventive maintenance for failure avoidance.

Figure 2:
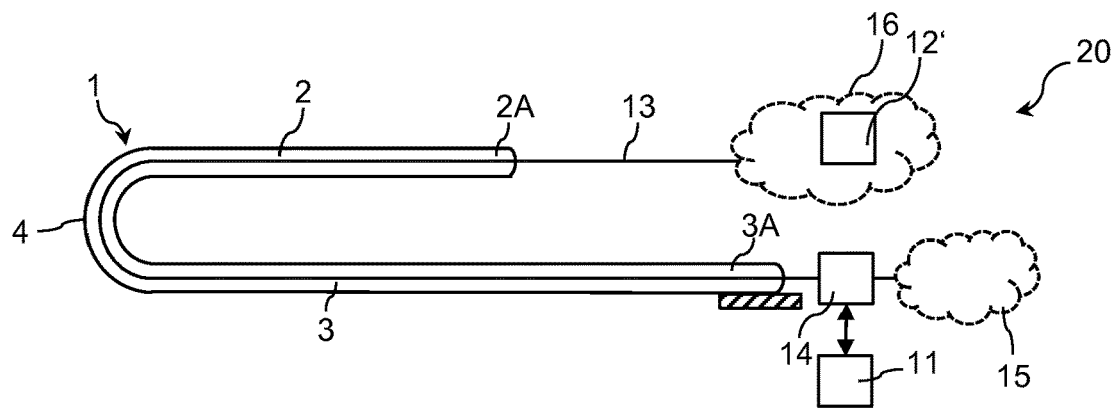
Figure 3:
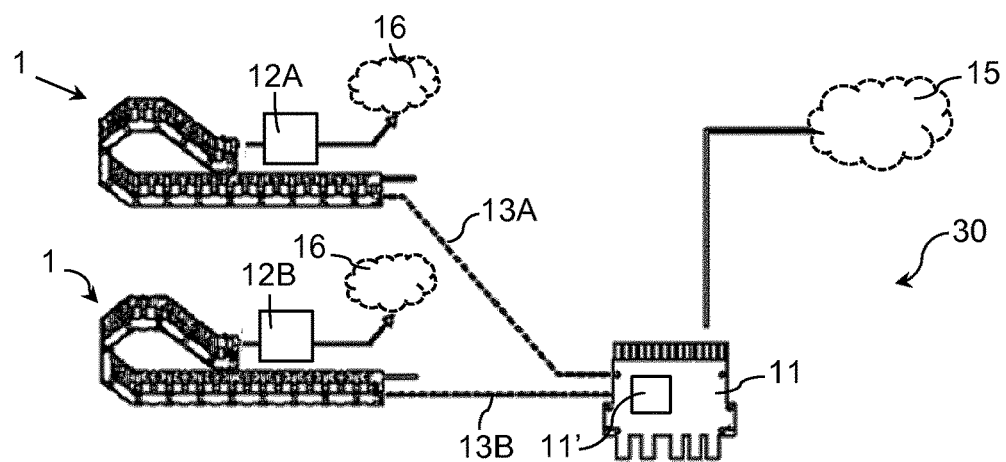
Figure 4:
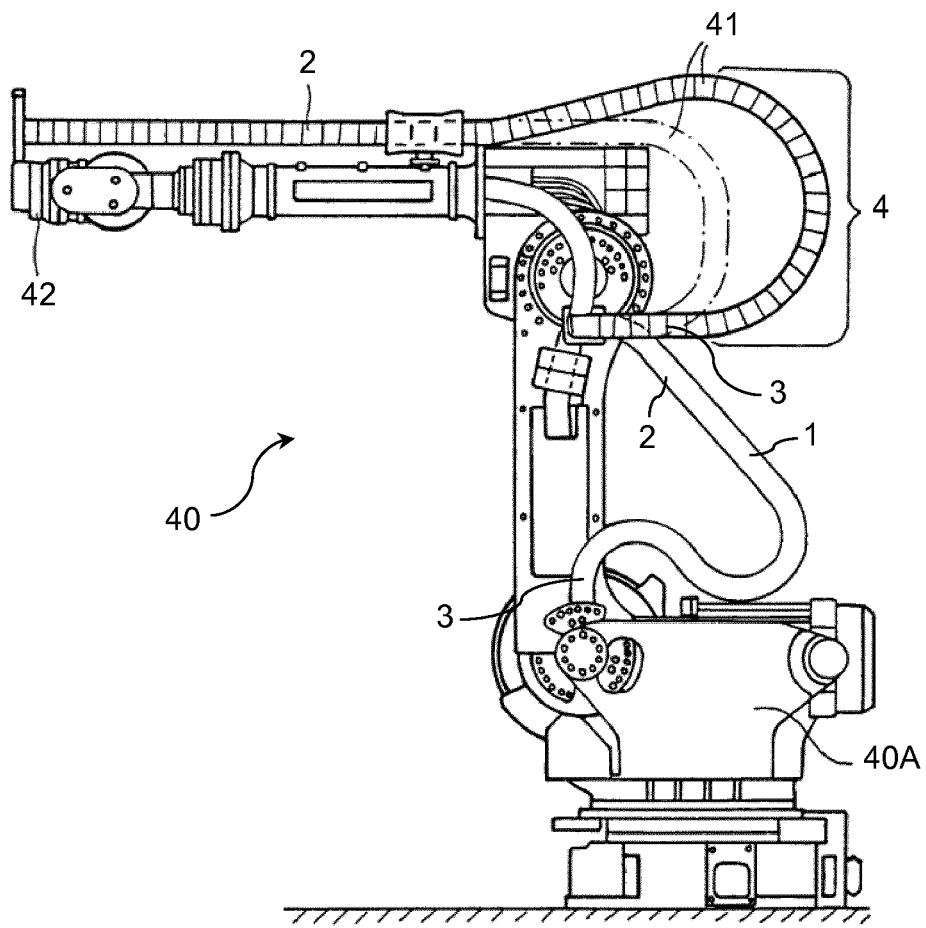

Further advantageous features and effects of the invention are explained below, without limiting the general applicability of the above, on the basis of preferred exemplary embodiments with reference to the appended drawings, in which:

FIG. 1: is a schematic diagram in side view of an energy guide chain with a monitoring system according to the invention in accordance with a first exemplary embodiment;

FIG. 2: is a schematic diagram in side view of an energy guide chain with a monitoring system according to the invention in accordance with a second exemplary embodiment;

FIG. 3: is a schematic diagram in side view of multiple energy guide chains with a monitoring system according to the invention in accordance with a third exemplary embodiment; and FIG. 4: is a side view of an industrial robot with the three-dimensionally deflectable energy guide chain, which may be provided with a monitoring system according to FIG. 1, FIG. 2 or FIG. 3.

FIG. 1 shows as an example of a dynamic line guide apparatus a schematically illustrated energy guide chain generally denoted 1. The energy guide chain 1 serves for protected guidance of cables, hoses or similar lines, which are not shown in greater detail. Between a moving run 2, here the upper run, and a stationary run 3, here the lower run, the energy guide chain 1 forms a co-traveling deflection arc 4 with specified curvature. To avoid line breaks, the deflection arc 4 in particular has a specified, minimum radius of curvature and in this way ensures the radii of curvature do not fall below the admissible radii of curvature for the guided lines. Line guide apparatus typically forms an inner guide channel, in which an application-dependent number and type of lines are guided. The design of the energy guide chain 1 is not critical for the invention, for example all per se known energy guide chains 1 consisting of individual, swivelably interconnected chain links are feasible.

FIGS. 1-3 show linearly and horizontally displaceable energy guide chains 1, merely by way of example. The moving run 2 ends at a first connection end 2A, for example in an end link which is fastened to a moving end of a mobile machine part (not shown). The stationary run 3 ends at a second connection end 3A, for example in an end link which is fastened to a fixed point of the machine or installation, as indicated schematically in FIGS. 1-2. The deflection arc 4 follows the movement of the traveling connection end 2A at half speed.

FIG. 1 is a schematic representation of a monitoring device, denoted generally as 10, as an essential aspect of the invention. The monitoring device 10 comprises a first device 11 with an interface for data communication and a second device 12 with an interface for data communication. On the basis of their interfaces, the devices 11, 12 are configured for data communication, in FIG. 1, for example, according to ETHERNET protocol or a protocol similar to or compatible with IEEE 802.3, such as, for example, PROFINET, and can thus exchange digital data with one another. The interfaces of the two devices 11, 12 are to this end connected via an ETHERNET data line 13, for example, a common CAT5 data cable with a twisted data line pair. A longitudinal portion of the data line 13 is here, as illustrated in FIG. 1, guided and protected in the line guide apparatus or energy guide chain 1.

In addition to the ETHERNET interface with data line 13, the first device 11 comprises at least one evaluation unit which is configured to detect information about the condition of the line to be monitored, here, for example, the data line 13 itself, on the basis of an information technological (IT-based) quality feature of the data link between the devices 11, 12.

The first device 11 may, for example, take the form of a conventional commercial modular computer platform with a microprocessor and various I/O interfaces including the ETHERNET interface. For IT-based checking of the quality feature of the data link between the devices 11, 12, a conventional commercial operating system may be used for the computer platform which is suitable for packet-switched data transmission according to an IP protocol and provides, as an inherent aspect of the protocol or with the operating system, a function for availability requests, such as for instance an ICMP echo request or a PING message according to TCP/IP protocol or comparable protocol families. In the evaluation unit, here in the first device 11, the previously known or predetermined network address of the second device 12 is stored for this purpose, such that the availability request can be addressed to the second device 12. The evaluation unit checks in ongoing manner, for example at regular time intervals, the quality of the data link on the basis of the absence of corresponding responses, for example ECHO responses or PONG messages from the second device 12 to the evaluation unit, here in the first device, or indeed on the basis of changes in the properties of these responses relative to a reference response. To this end, the evaluation unit is provided with suitable software functionality and moreover has a software-based diagnostic function, which continuously checks the quality feature in question.

The detected number of packet losses can be used as the quality feature, this typically representing an output value of an ICMP echo request or of the PING function. If the number of packet losses increases to above a predetermined number, this in particular indicates wear and tear or interruption of the data line 13 caused by wear or malfunction. In this case, the evaluation unit outputs a warning or error message to a higher-level monitoring means (cf. FIG. 3), for example, via the data line 13 or preferably via a separate channel, so as to enable predictive maintenance.

The second device 12 may in principle be any inexpensive conventional commercial network device or component which supports the selected protocol function, such as for instance availability requests, for example according to the TCP/IP protocol, or indeed is at least suitable for sending receipt acknowledgments to the first device if for instance a field bus protocol such as CAN bus, EIA-485 or the like is used instead of an ETHERNET data link. In the latter case, the evaluation unit, here in the first device 11, may, for example, simply monitor whether a receipt acknowledgment from second device 12 is received for each request, likewise outputting a warning or error message when a predetermined error threshold is reached.

Like the first device 11, the second device 12 may also be provided as a specially programmed hardware module.

Utilization of per se known communications technology offers further advantages. As illustrated in FIG. 1, the two devices 11, 12 of the monitoring device 10 are each connected to a switching device 14, such as an ETHERNET switch, or a comparably active switching or network device. This enables the monitoring device to be integrated 10 with its devices 11, 12 seamlessly into an existing or desired application-dependent network or bus structure, and for a data line 13 provided in any event for application-related user data to be used for monitoring. The data line 13 may, for example, serve for user data, such as for example control and/or measurement data, which are exchanged between a first region 15 of the data network or of the data bus and a second region 16 of the data network or of the data bus. The regions 15, 16 are here connected via the data line 13 by way of the switching devices 14.

Owing to the switching devices 14, the devices 11, 12 of the monitoring device 10 do not bring about any notable impairment of communication between the regions 15, 16. The switching devices 14 are both arranged as close as possible to the connection ends 2A, 3A of the energy guide chain 1, in order to limit the checked line portion as far as possible to the region in the line guide apparatus.

The first region 15 of the communications topology may in this case be arranged on a stationary part of the machine or installation and, for example, comprise the control unit. The second region 16, for example, comprises sensors and/or actuators on the part of the machine or installation capable of relative motion.

In the architecture of the monitoring device 10 according to FIG. 1, a second device 12 expressly configured for the purposes of the monitoring device 10 is provided, in addition to the specially configured evaluation unit programmed with the necessary software in the first device 11. However, this is unnecessary owing to the utilization of existing technology.

Provided a unique network address or bus address of a further device 12' provided in the second region 16 of the data network or data bus is known in advance, this further device 12' can be used for the above purposes. Common network devices or field devices typically already include the necessary technology, in any event in the case of suitable selection of the quality feature in question. A corresponding second exemplary embodiment is shown schematically in FIG. 2. The monitoring device 20 according to FIG. 2 differs in that the evaluation unit, implemented, for example, in the first device 11, communicates directly with an application-specific device 12' in the second region 16. The further device 12' may then, for example, be inherently configured to respond to an ECHO request, or to acknowledge receipt of addressed bus data. A particular second device and a switching device according to FIG. 1 are thus not absolutely essential. Moreover, the structure and function of the monitoring device 20 according to FIG. 2 corresponds to those of FIG. 1.

A further variant of a monitoring device 30 is shown in FIG. 3. Here, as first device 11, an application-specific control or monitoring unit is, for example, provided, into which an evaluation unit 11' is integrated as additional module, in the form of suitable hardware or software. The evaluation unit 11' is in this case configured to detect in parallel the selected IT-based quality feature from a plurality of data links between the common first device 11 and in each case one of several second devices 12A, 12B etc. The first device 11 with the evaluation unit 11' may in this way monitor in parallel multiple lines 13A, 13B etc. in different energy guide chains 1. FIG. 3 illustrates purely by way of example two monitored energy guide chains 1. The first device 11 may here be connected for further functions with the first network or bus region 15 and via the lines 13A, 13B etc. also in each case with multiple second network or bus regions 16 of a more complex installation or machine.

FIG. 4 shows as an exemplary application for a monitoring device 10, 20, 30 an articulated robot 40, for example, for fully automated handling of workpieces in a manufacturing process. From the stationary base 40A of the articulated robot, a first linearly displaceable energy guide chain 1, as in FIGS. 1-3, leads to a revolute joint, from which a three-dimensionally deflectable second energy guide chain 41 (for example, according to WO 2004/093279 A1) continues to the end effector 42 or terminal robot tool. At the end effector 42, a number of actuators and sensors are typically provided, which are already suitable for a common field bus protocol or for example the PROFINET protocol.

The address of these field devices or network devices is predeterminable or programmable. Using a monitoring device 10, 20, 30 according to the principle of FIGS. 1-3, at least one or indeed all data lines which are guided by the energy guide chains 1, 41 are monitored for their wear condition. To this end, all that is needed is an inexpensively implementable first device 11, for example, with an evaluation unit 11' in the form of a software module on a computer. An existing control unit or monitoring unit may be used for this purpose (cf. FIG. 3).

The proposed monitoring system for monitoring line condition thus offers an inexpensive solution for supporting predictive maintenance and/or for reducing or avoiding downtime. The invention makes it possible, inter alia, to make maximum use of more failure-susceptible and optionally indeed costly data lines, special lines or the like with regard to their possible service life, i.e., to avoid unnecessarily early replacement.

LIST OF REFERENCE SIGNS

FIGS. 1-3
1 Line guide apparatus (energy guide chain)
2 Moving run
2A First connection end
3 Stationary run
3A Second connection end
4 Deflection arc
10, 20, 30 Monitoring device
11 First device
12; 12'; 12A, 12B Second device
13; 13A, 13B Data line
14 Switching device (ETHERNET switch)
15 First region (customer network/bus)
16 Second region (customer network/bus)
FIG. 4
1 First energy guide chain (linearly displaceable)
2 First run
3 Second run
4 Deflection arc
40 Articulated robot
40A Base
41 Second energy guide chain (three-dimensionally deflectable)
42 End effector

The invention claimed is:

1. A monitoring system for monitoring the condition of a line guided by a line guide apparatus, the monitoring system comprising:
    a displaceable line guide apparatus (1; 41) for guiding a line between a stationary connection point and a connection point mobile relative thereto, wherein the line guide apparatus (1; 41) forms at least one mobile run (2) with a first connection end (2A) and a further run (3) with a second connection end (3A);
    at least one line (13; 13A; 13B), which is guided by the line guide apparatus (1; 41); and
    a monitoring device (10; 20; 30) having an evaluation unit which detects information about the condition of the line to be monitored;
    wherein
    the monitoring device comprises a first device (11) with an interface for data communication and a second device (12; 12') with an interface for data communication, which devices are configured for data communication according to a protocol for digital data transmission;
    the at least one line (13; 13A; 13B) is guided by the line guide apparatus (1; 41) and includes an electrical data line (13), the interfaces of the first and second devices (11, 12) for data communication being connected via the electrical data line (13); and
    the evaluation unit is configured to detect information about the condition of the line to be monitored on the basis of an information technological quality feature of the data link between the first device (11) and the second device (12; 12').

2. The monitoring system according to claim 1, wherein the protocol is a protocol for packet-based digital data transmission, preferably a data network protocol according to IEEE 802.3 and/or the devices (11; 12, 12A) are configured for data communication with packet switching.

3. The monitoring system according to claim 1, wherein the protocol is a data bus protocol.

4. The monitoring system according to claim 1, wherein each of the interfaces of the two devices has a unique address for data communication, wherein the quality feature is determinable using information technology (IT) by data transmission addressed to the second device (12, 12').

5. The monitoring system according to claim 4, wherein the evaluation unit (11) is configured to determine the quality feature using IT or using software on the basis of
    availability requests from the first device to the second device; and/or
    receipt acknowledgments from the second device to the first device; and/or
    packet losses or packet loss rates in packet-based data transmission; and/or
    at least one protocol-inherent function for assessing a quality of service (QoS) parameter.

6. The monitoring system according to claim 5, wherein the first device sends availability requests (PING) according to a higher-level protocol to the second device, and the evaluation unit assesses the quality of the data link on the basis of the absence of corresponding responses (PONG) or changes thereto relative to a reference response.

7. The monitoring system according to claim 1, wherein the evaluation unit (11) is configured to determine the quality feature continuously at regular intervals.

8. The monitoring system according to claim 1, wherein the first device (11) comprises the evaluation unit.

9. The monitoring system according to claim 1, wherein an active network device (14) is connected with the line at the first connection end (3A) to which network device the first device (11) is connected; and/or
    an active network device (14) is connected with the line at the second connection end (2A) to which network device the second device (12) is connected.

10. The monitoring system according to claim 9, wherein the second device (12) provided expressly for the monitoring system.

11. The monitoring system according to claim 1, wherein the line guide apparatus is an energy guide chain (1; 41) including a deflection arc (4) between the mobile run (2) and the stationary run (3), and/or
    at least one further line is guided by the line guide apparatus, wherein each further line has a nominal service life which is greater than or equal to the nominal service life of the line (13, 13A, 13B), via which the interfaces of the first and second devices are connected.

12. The monitoring system according to claim 1, wherein the interfaces are embodied for POWERLAN, PLC or the IEEE 1901 standard and the interfaces of the first and second devices are connected for signaling via a power supply line guided by the line guide apparatus.

13. The monitoring system according to claim 1, wherein the interfaces of the first and second devices (11, 12) are connected for data communication via a hybrid servo line comprising the electrical data line (13) guided by the line guide apparatus.

14. The monitoring system according to claim 1, wherein the first device (11) is arranged stationarily at the base-side end of the line guide apparatus and the second device (12; 12') is arranged on a mobile machine part which is supplied with data and/or energy by the line guide apparatus (1; 41).

15. An industrial robot (40) comprising the monitoring system according to claim 1, wherein the line guide apparatus (41) is three-dimensionally deflectable, and as second device an addressable network device or field device is used which is provided on an end effector (42) of the industrial robot.

16. Use of the monitoring system according to claim 1 for monitoring the condition of a data or power supply cable in an energy guide chain in ongoing operation for the purpose of preventive maintenance.

17. A monitoring system for monitoring the condition of a line guided by a line guide apparatus, the monitoring system comprising:
a displaceable line guide apparatus (1; 41) for guiding a line between a stationary connection point and a connection point mobile relative thereto, wherein the line guide apparatus (1; 41) forms at least one mobile run (2) with a first connection end (2A) and a further run (3) with a second connection end (3A);
at least one line (13; 13A; 13B), which is guided by the line guide apparatus (1; 41);
a monitoring device (10; 20; 30) having an evaluation unit which detects information about the condition of the line to be monitored, the monitoring device comprises a first device (11) with an interface for data communication and a second device (12; 12') with an interface for data communication, which devices are configured for data communication according to a protocol for digital data transmission, the interfaces of the first and second devices (11, 12) are connected by way of the at least one line (13; 13A; 13B); and
an active network device (14) is connected with the line at the first connection end (3A) to which network device the first device (11) is connected and/or the second connection end (2A) to which network device the second device (12) is connected, and
wherein
the evaluation unit is configured to detect information about the condition of the line to be monitored on the basis of an information technological quality feature of the data link between the first device (11) and the second device (12; 12'); and
the monitoring device (20) uses as the second device (12) an addressable network device or field device present in the data network or data bus.

18. A monitoring system for monitoring the condition of a line guided by a line guide apparatus, the monitoring system comprising:
a displaceable line guide apparatus (1; 41) for guiding a line between a stationary connection point and a connection point mobile relative thereto, wherein the line guide apparatus (1; 41) forms at least one mobile run (2) with a first connection end (2A) and a further run (3) with a second connection end (3A);
at least one line (13; 13A; 13B), which is guided by the line guide apparatus (1; 41); and
a monitoring device (10; 20; 30) having an evaluation unit which detects information about the condition of the line to be monitored;
wherein
the monitoring device comprises a first device (11) with an interface for data communication and a second device (12; 12') with an interface for data communication, which devices are configured for data communication according to a protocol for digital data transmission;
the interfaces of the two devices are connected by way of the at least one line (13; 13A; 13B) guided by the line guide apparatus (1; 41);
the evaluation unit is configured to detect information about the condition of the line to be monitored on the basis of an information technological quality feature of the data link between the first device (11) and the second device (12; 12');
each of the interfaces of the two devices has a unique address for data communication;
the quality feature is determinable using information technology (IT) by data transmission addressed to the second device (12, 12') and through said line (13, 13A, 13B) guided by the line guide apparatus (1; 41), by way of which the interfaces of the first and second devices are connected; and
the evaluation unit (11) is configured to determine the quality feature on the basis of
availability requests from the first device to the second device; and/or
receipt acknowledgments from the second device to the first device; and/or
packet losses or packet loss rates in packet-based data transmission; and/or
at least one protocol-inherent function for assessing a quality of service (QoS) parameter.

19. The monitoring system according to claim 18, wherein the first device sends availability requests (PING) according to a higher-level protocol to the second device, and the evaluation unit assesses the quality of the data link on the basis of the absence of corresponding responses (PONG) or changes thereto relative to a reference response.

20. The monitoring system according to claim 18, wherein
the line guide apparatus is an energy guide chain (1; 41) including a deflection arc (4) between the mobile run (2) and the stationary run (3), and/or
at least one further line is guided by the line guide apparatus, wherein each further line has a nominal service life which is greater than or equal to the nominal service life of the line (13, 13A, 13B), via which the interfaces of the first and second devices are connected.

* * * * *